United States Patent [19]
Cleveland et al.

[11] Patent Number: 5,642,311
[45] Date of Patent: Jun. 24, 1997

[54] OVERERASE CORRECTION FOR FLASH MEMORY WHICH LIMITS OVERERASE AND PREVENTS ERASE VERIFY ERRORS

[75] Inventors: Lee Cleveland; Chung Chang, both of Santa Clara; Yuan Tang, San Jose; Nancy Leong, Sunnyvale; Michael Fliesler, Santa Cruz; Tiao-Hua Kuo, San Jose, all of Calif.

[73] Assignee: Advanced Micro Devices, Sunnyvale, Calif.

[21] Appl. No.: 547,494

[22] Filed: Oct. 24, 1995

[51] Int. Cl.⁶ ............................................. G11C 7/00
[52] U.S. Cl. ................... 365/185.3; 365/185.29; 365/218
[58] Field of Search ............. 365/185.29, 185.3, 365/218

[56] References Cited

U.S. PATENT DOCUMENTS

| | | | |
|---|---|---|---|
| 5,237,535 | 8/1993 | Mielke et al. | 365/185.3 |
| 5,335,198 | 8/1994 | Van Buskirk et al. | 365/185 |
| 5,347,489 | 9/1994 | Merchant et al. | 365/203 |
| 5,359,558 | 10/1994 | Chang et al. | 365/189 |
| 5,424,993 | 6/1995 | Lee et al. | 365/218 |
| 5,508,959 | 4/1996 | Lee et al. | 365/185.3 |

FOREIGN PATENT DOCUMENTS 92 11876  10/1992  France .

*Primary Examiner*—Son T. Dinh
*Attorney, Agent, or Firm*—Fliesler, Dubb, Meyer, & Lovejoy

[57] ABSTRACT

An integrated circuit including an array of flash EEPROM memory cells wherein overerase correction is provided after application of each erase pulse.

5 Claims, 3 Drawing Sheets

OVERERASE CORRECTION FOR FLASH MEMORY WHICH LIMITS OVERERASE AND PREVENTS ERASE VERIFY ERRORS

BACKGROUND OF THE INVENTION

1. Field of the Invention

The present invention relates to a integrated circuit memory including an array of flash EEPROM memory cells and circuitry to provide for overerase correction for the flash EEPROM cells.

2. Description of the Related Art

FIG. 1 shows a typical configuration for an integrated circuit including a flash EEPROM memory array 100 and circuitry enabling programming, erasing, reading, and overerase correction for memory cells in the array 100. The flash EEPROM array 100 is composed of individual cells, such as 102. Each cell has a drain connected to a bitline, such as 104, each bitline being connected to a bitline pull up circuit 106 and column decoder 108. Sources of the array cells are connected to Vss, while their gates are each connected by a wordline to a row decoder 110.

The row decoder 110 receives voltage signals from a power supply 112 and distributes the particular voltage signals to the wordlines as controlled by a row address received from a processor or state machine 114. Likewise, the bitline pull up circuit 106 receives voltage signals from the power supply 112 and distributes the particular voltage signals to the bitlines as controlled by a signal from the processor 114. Voltages provided by the power supply 112 are provided as controlled by signals received from processor 114.

The column decoder 108 provides signals from particular bitlines to sense amplifiers or comparators 116 as controlled by a column address signal received from processor 114. The sense amplifiers 116 further receive a signal from reference cells of reference array 118. An example of circuitry for reference array 118, as well as operation of such circuitry is provided in U.S. patent application Ser. No. 08/160,582 entitled "Programmed Reference", and U.S. Pat. No. 5,335,198 entitled "Flash EEPROM Array With High Endurance", both of which are incorporated herein by reference. With signals from the column decoder 108 and reference array 118, the sense amplifiers 116 then each provide a signal indicating a state of a bitline relative to a reference cell line to which it is connected through data latches or buffers 120 to processor 114.

To program a cell in the flash memory array 100, high gate-to-drain voltage pulses are provided to the cell from power supply 112 while a source of the cell is grounded. For instance, during programming typically multiple gate voltage pulses of 10 V are each applied for approximately two to three microseconds to a cell, while a drain voltage of the cell is set to 5.5 V and its source is grounded. The large gate-to-drain voltage pulses enable electrons flowing from the source to drain to overcome an energy barrier to produce "hot electrons" which are accelerated across a thin dielectric layer enabling the electrons to be driven onto a floating gate of the cell. This programming procedure, termed "hot electron injection" results in an increase of a threshold voltage for the cell, the threshold being the gate-to-source voltage required for the cell to conduct.

To erase a cell in the flash memory array 100, a procedure known as Fowler-Nordheim tunneling is utilized wherein relatively high negative gate-to-source voltage pulses are applied for a few tenths of a second each. For instance, during erase multiple gate voltage pulses of −10 V are applied to a cell, while a drain of the cell is set to 5.5 V and its source is floating. The large negative gate-to-source voltage pulses enable electrons to tunnel from the floating gate of a cell reducing its threshold.

To represent a data bit, the floating gate of a cell is programmed or erased as described above. In a programmed state, the threshold voltage of a cell is typically set at greater than 6.5 volts, while the threshold voltage of a cell in an erased state is typically limited below 3.0 volts. To read a cell, a control gate voltage between the 3.0 and 6.5 volt range, typically 5 V, is applied. The 5 V read pulse is applied to the gate of an array cell as well as a cell in reference array 118 having a threshold near 5 V. In a programmed state with an array cell in array 100 having a threshold above 6.5 V, current provided by the reference cell with a threshold of 5 V will be greater indicating a programmed cell exists. In an erased state with a threshold of a cell in array 100 below 3.0 V, current provided by the array cell will be greater than the reference cell with a threshold of 5 V indicating an erased cell. To verify programming or erase, a read voltage is similarly applied to both a cell in the array and to cells in the reference array 118. For programming, a reference cell having a threshold of 6.5 V is used for a comparison, while for erase, a reference cell having a threshold of 3.0 V is used for comparison.

In a flash memory array, all cells are typically erased simultaneously. Erasing of the memory cells is typically done by repeated applications of the short erase pulses, described above, applied to each of the cells in an array, such as flash memory array 100. After each erase pulse, erase verify is performed cell by cell to determine if each cell in the array has a threshold above a limit, such as 3.0 V, or if a cell is "undererased". If an undererased cell is detected, an additional erase pulse is applied to the entire array. With such an erase procedure, a cell which is not undererased will also be repeatedly erased, and its floating gate may eventually acquire a threshold below zero volts. A cell with a threshold erased below zero volts is referred to as being "overerased".

An overerase condition is undesirable because the programming characteristics of an overerased cell more rapidly become deteriorated, reducing the number of times the cell can be reprogrammed which is referred to as the cells "endurance". Overerased cells are also undesirable because they create bitline leakage current during program or read procedures. For instance, during program or read, only one wordline carries a positive voltage, while the remaining wordlines are typically grounded. With wordlines grounded, or at 0 V, a cell with a threshold voltage below 0 V will conduct a bitline leakage current. With bitline leakage current, power supplies providing power to a bitline during programming may become overloaded. Similarly, with bitline leakage current during read, read errors may occur.

To prevent overerase, manufacturers of integrated circuits containing flash memory cells typically provide an overerase correction mechanism. FIG. 2 is a flow chart illustrating a prior art erase and overerase correction procedure. In the procedure, erase is performed first, and then overerase correction is provided. The procedure of FIG. 2 will be described in more detail below.

First, for the erase procedure, in steps 202 and 204, the row address and column address provided by processor 114 are set to an initial address. Next, in step 206, an erase verify pulse is provided to a cell as selected by the row and column addresses. Outputs from sense amplifiers 116 are then utilized by processor 114 to determine if the cell referenced by the row and column addresses is undererased. If the cell is undererased an erase pulse is applied in step 208 to the entire array and the erase verify step 206 is repeated.

If the cell referred to by the row and column addresses is not undererased in step 206, the column address is incremented in step 210. Next, in step 212, if the last column address has not been exceeded, control returns to step 206. Otherwise, in step 214 the row address is incremented, and if the last row address has not been exceeded in step 216, control is returned to step 206. If the last row has been exceeded, the column address is reset in step 218 to begin the overerase correction procedure.

Next, in the overerase correction procedure, in step 220 power supply 112 is controlled to provide an overerase verify pulse to bitlines of the cells referred by the column address, while wordlines remain grounded. Outputs from sense amplifiers 116 are then provided to the processor 114 to determine if the bitline referenced by the column address is providing a leakage current. If the bitline is providing a leakage current, overerased cells exist, so in step 222 power supply 112 is controlled to provide an overerase correction pulse to all the cells connected to the bitline referred to by the column address and step 220 is repeated.

The overerase correction pulse applied in step 222 is a relatively high voltage applied to the drain of a cell, such as 6 V, while its gate and source are typically grounded. U.S. patent application Ser. No. 08/269,530 entitled "Multi-stepped Threshold Convergence For A Flash Memory Array", and U.S. Pat. No. 5,359,558 entitled "Flash EEPROM Array With Improved High Endurance", both incorporated herein by reference, disclose further details regarding application of overerase correction pulses.

If no bitline leakage current is identified in step 220, the column address is incremented in step 224. Next, in step 226, if the last column address has not been exceeded, control is returned to step 220. Otherwise, the overerase correction procedure is complete.

Although the overerase correction procedure illustrated in FIG. 2 eliminates overerased cells, because overerased cells may have been present during the erase procedure, the endurance of cells in the array will be reduced.

Further, because overerased cells may have been present during erase verify in step 206, undererased, or programmed cells may still be present after the erase procedure is complete. In explanation, during erase, one cell in an array may erase on the order of one 100 times faster than other cells. If the cell verified in step 206 is erased very slowly, while a cell in the same column is erased rapidly by continual applications of the erase pulse of step 208, the cell in the same column which erases faster may become over-erased before the cell addressed in step 206 is verified as properly erased. Since during verify in step 206, the remaining cells on the column other than the cell addressed have grounded wordlines, the overerased cell will conduct a bitline leakage current. With such bitline leakage current adding to the current conducted by the addressed cell, a sense amplifier comparing the current of the addressed cell to current of a reference cell in reference array 118 will prematurely indicate for step 206 that the addressed cell has been properly erased. Thus, after completion of erase, cells may remain undererased.

SUMMARY OF THE INVENTION

The present invention provides an overerase correction procedure which limits the extent which cells are overerased during an erase procedure.

The present invention further prevents erase verification errors during an erase procedure due to overerased cells, thus preventing undererased cells after completion of an erase procedure.

The present invention is an integrated circuit including an array of flash EEPROM memory cells wherein overerase correction is provided after application each erase pulse.

BRIEF DESCRIPTION OF THE DRAWINGS

Further details of the present invention are explained with the help of the attached drawings in which.

DETAILED DESCRIPTION

Figure 1:
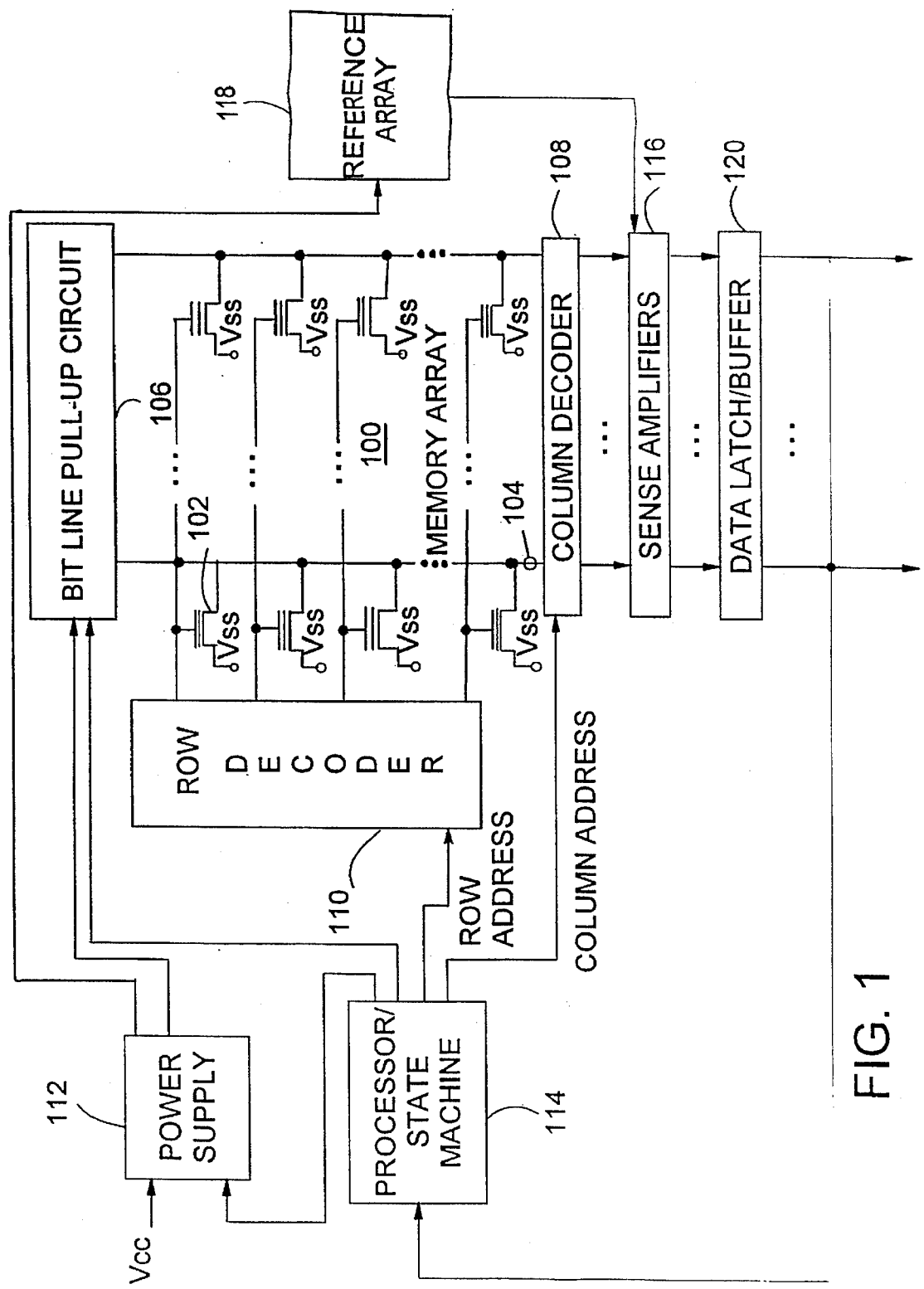
FIG. 1 shows a typical configuration for an integrated circuit including a flash EEPROM memory array and circuitry enabling programming, erasing, reading, and overerase correction in the array.
Figure 3:
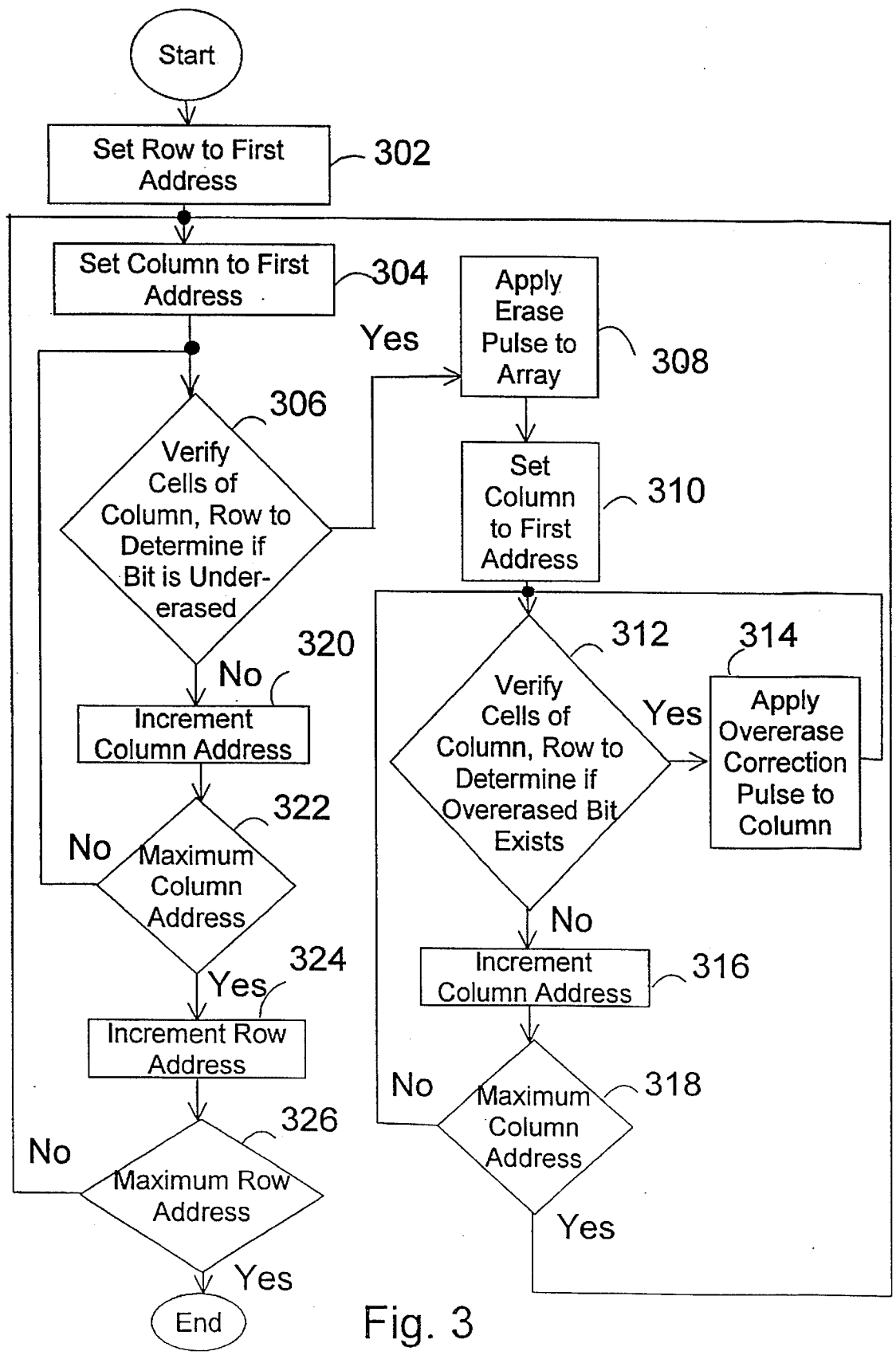
FIG. 3 is a flow chart illustrating a combined erase and overerase correction procedure of the present invention.

The present is an integrated circuit configured as shown in FIG. 1 and further configured to provide overerase correction after application of each erase pulse. FIG. 3 is a flow chart illustrating the combined erase and overerase correction procedure of the present invention. The procedure of FIG. 3 will be described in more detail below.

Figure 2:
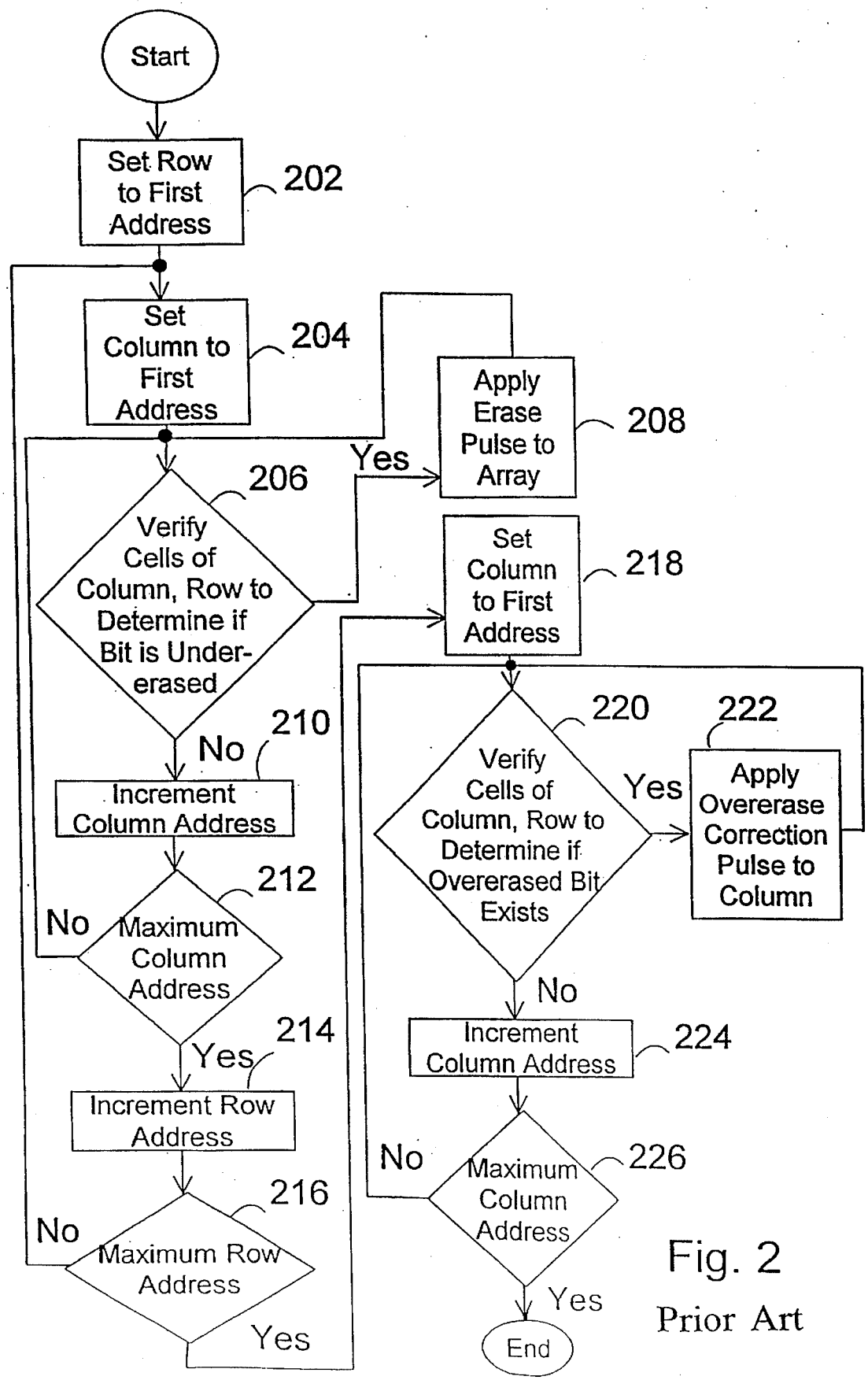
FIG. 2 is a flow chart illustrating a prior art erase and overerase correction procedure.

First, similar to FIG. 2, in steps 302 and 304, the row address and column address provided by processor 114 are set to an initial address. Next, in step 306, a erase verify pulse is provided to a cell as selected by the row and column addresses. Outputs from sense amplifiers 116 are then utilized by processor 114 to determine if the cell referenced by the row and column addresses is undererased. If the cell is undererased an erase pulse is applied in step 308.

Unlike the flowchart of FIG. 2, which after step 308 returns to erase verify in step 306, for the present invention as illustrated in FIG. 3, the column address provided by processor 114 is reset to an initial address in step 310 to begin an overerase correction procedure.

Next, in the overerase correction procedure, in step 312 power supply 112 is controlled to provide an overerase verify pulse to bitlines of the cells referred by the column address, while wordlines remain grounded. Outputs from sense amplifiers 116 are then provided to the processor 114 to determine if the bitline referenced by the column address is providing a leakage current. If the bitline is providing a leakage current, overerased cells exist, so in step 314 power supply 112 is controlled to provide an overerase correction pulse to all the cells connected to the bitline referred to by the column address and step 312 is repeated.

If no bitline leakage current is identified in step 312, the column address is incremented in step 316. Next, in step 318, if the last column address has not been exceeded, control is returned to step 312. Otherwise, control is returned from step 318 to step 304 to return to the erase procedure.

Control is returned to step 304, although alternatively if a set column address were stored when step 306 referred control to 308, the set column address could be restored and control returned to step 306 after step 318.

Once the cell referred to by the row address and column address is not undererased in step 306, the column address is incremented in step 320. Next, in step 322, if the last column address has not been exceeded, control returns to step 306. Otherwise, in step 324 the row address is incremented, and if the last row address has not been exceeded in step 326, control is returned to step 306. If the last column and row have has been exceeded the combined erase and overerase procedure of the present invention is complete.

By applying the overerase correction procedure after each erase pulse, the extent to which cells are overerased will be reduced improving the endurance of cells in the array. Further, because overerased cells are removed after each erase pulse, bitline leakage current will not be present during erase verify, thus preventing undererased cells from existing upon completion of the erase procedure.

Although the invention has been described above with particularity, this was merely to teach one of ordinary skill in the art how to make and use the invention. Many modifications will fall within the scope of the invention, as that scope is defined by the claims which follow.

What is claimed is:

1. A method of applying overerase correction to an array of flash memory cells, wherein the flash memory cells are erased by application of a plurality of erase pulses, the method comprising:

determining after each erase pulse in the plurality of erase pulses is applied if one of the flash memory cells is overerased; and applying an overerase correction pulse after each determining step if the respective determining step indicates an overerased cell exists.

2. A method of applying overerase correction to an array of flash memory cells, the method comprising the steps of:

(a) applying an erase pulse to the array of flash memory cells;

(b) determining if one of the flash memory cells in the flash memory array is overerased and proceeding to step (c) if an overerased cell is detected and proceeding to step (d) if an overerased cell is not detected;

(c) applying an overerase correction pulse to the overerased cell and proceeding to step (b); and (d) determining if one of the flash memory cells in the array is undererased and proceeding to step (a) if an undererased cell is detected.

3. A method of applying overerase correction to an array of flash memory cells, the method comprising the steps of:

(a) applying an erase pulse to the array of flash memory cells;

(b) initializing a column address;

(c) determining if one of the flash memory cells in a selected column of the flash memory cells connected to a common bitline is overerased, the selected column being selected by the column address, and proceeding to step (d) if an overerased cell is detected and proceeding to step (e) if an overerased cell is not detected;

(d) applying an overerase correction pulse to flash memory cells in the selected column and proceeding to step (c);

(e) incrementing the column address;

(f) determining if the column address is a maximum value and proceeding to step (c) if the column address is not a maximum value and proceeding to step (g) if the column address is a maximum value;

(g) determining if one of the flash memory cells in the array is undererased and proceeding to step (a) if the undererased cell is detected.

4. An integrated circuit comprising:

an array of flash EEPROM cells, each cell having its control gate connected to a wordline in a row of wordlines, its drain connected to a bitline in a column of bitlines, and a source connected to Vss;

a reference array for providing reference signals;

sense amplifiers, each sense amplifier having a first input connected to receive a given bitline signal from a bitline in the column of bitlines and a given reference signal from the reference signals and providing an output indicating a state of the given bitline signal relative to the given reference signal;

a power supply receiving a control signal, the power supply being coupled to the bitlines and the wordlines for providing a power supply signal, the power supply signal being an erase pulse, an overerase verify pulse, or an overerase correction pulse as determined by the control signal; and a processor coupled to the power supply for providing the control signal, and the sense amplifier for receiving the sense amplifier output, the processor being configured to perform the following steps:

(a) providing the control signal to enable the power supply to provide the erase pulse to the array of flash memory cells;

(b) providing the control signal to enable the power supply to provide the overerase verify pulse, and then determining from the sense amplifier output if one of the flash memory cells in the flash memory array is overerased and proceeding to step (c) if an overerased cell is detected and proceeding to step (d) if an overerased cell is not detected;

(c) providing the control signal to enable the power supply to provide the overerase correction pulse to the overerased cell and proceeding to step (b); and (d) providing the control signal to enable the power supply to provide the erase verify pulse, and then determining from the sense amplifier output if one of the flash memory cells in the array is undererased and proceeding to step (a) if an undererased cell is detected.

5. An integrated circuit comprising:

an array of flash EEPROM cells, each cell having its control gate connected to a wordline in a row of wordlines, its drain connected to a bitline in a column of bitlines, and a source connected to Vss;

a column decoder responsive to a column address signal, the column decoder being connected to the columns of bitlines for supplying a signal from a selected column as determined from the column address signal;

a reference array for providing a reference signal;

a sense amplifier having a first input connected to receive the signal from the selected column from the column decoder and the reference signal from the reference array and providing an output indicating a state of the signal from the selected column relative to the reference signal;

a power supply receiving a control signal, the power supply being coupled to the bitlines and the wordlines for providing a power supply signal, the power supply signal being an erase pulse, an erase verify pulse, an overerase verify pulse, or an overerase correction pulse as determined by the control signal; and a processor coupled to the column decoder to provide the column address signal, the power supply for providing the control signal, and the sense amplifier for receiving the sense amplifier output, the processor being configured to perform the following steps:

(a) providing the control signal to enable the power supply to provide the erase pulse to the array of flash memory cells;

(b) initializing a column address;

(c) applying the column address to the column decoder and providing the control signal to enable the power supply to provide the overerase verify pulse, and then determining from the sense amplifier output if one of the flash memory cells in a selected column is overerased, and proceeding to step (d) if an overerased cell is detected and proceeding to step (e) if an overerased cell is not detected;

(d) providing the control signal to enable the power supply to provide the overerase correction pulse to cells in the selected column and proceeding to step (c);

(e) incrementing the column address;

(f) determining if the column address is a maximum value and proceeding to step (c) if the column address is not a maximum value and proceeding to step (g) if the column address is a maximum value; and (g) providing the control signal to enable the power supply to provide the erase verify pulse, and then determining from the sense amplifier output if one of the flash memory cells in the array is undererased and proceeding to step (a) if an undererased cell is detected.

* * * * *